(12) United States Patent
Hirooka

(10) Patent No.: US 7,354,699 B2
(45) Date of Patent: Apr. 8, 2008

(54) METHOD FOR PRODUCING ALIGNMENT MARK

(75) Inventor: Taisuke Hirooka, Kobe (JP)

(73) Assignee: Hitachi Metals, Ltd., Tokyo (JP)

(*) Notice: Subject to any disclaimer, the term of this patent is extended or adjusted under 35 U.S.C. 154(b) by 166 days.

(21) Appl. No.: 10/426,753

(22) Filed: May 1, 2003

(65) Prior Publication Data

US 2004/0219463 A1    Nov. 4, 2004

(51) Int. Cl.
*G03F 9/00* (2006.01)

(52) U.S. Cl. .................... 430/322; 430/22; 430/30

(58) Field of Classification Search ............. 403/312, 403/313, 320, 22
See application file for complete search history.

(56) References Cited

U.S. PATENT DOCUMENTS

| | | | | |
|---|---|---|---|---|
| 4,338,620 A | * | 7/1982 | Kawabe | 257/520 |
| 4,447,596 A | * | 5/1984 | Makino et al. | 528/353 |
| 5,252,414 A | * | 10/1993 | Yamashita et al. | 430/22 |
| 5,516,430 A | | 5/1996 | Hussinger | 216/36 |
| 5,764,454 A | | 6/1998 | Hishida | 360/126 |
| 5,837,963 A | | 11/1998 | Kitahara | 219/121.69 |
| 5,847,468 A | * | 12/1998 | Nomura et al. | 257/797 |
| 6,202,289 B1 | | 3/2001 | Yoshimura et al. | 29/603.12 |
| 6,399,259 B1 | * | 6/2002 | Chang | 430/22 |
| 6,449,123 B1 | | 9/2002 | Tsujimoto et al. | 360/126 |
| 2004/0063037 A1 | | 4/2004 | Hasegawa et al. | |
| 2005/0231732 A1 | * | 10/2005 | Monshouwer et al. | 356/508 |

FOREIGN PATENT DOCUMENTS

| | | | |
|---|---|---|---|
| JP | 56-094353 A | | 7/1981 |
| JP | 58-015233 A | | 1/1983 |
| JP | 58-100424 | * | 6/1983 |
| JP | 03-104113 A | | 5/1991 |
| JP | 04-147631 A | | 5/1992 |
| JP | 9-081922 | | 3/1997 |
| JP | 10-134317 | | 5/1998 |
| JP | 11-126311 | | 5/1999 |
| JP | WO 9928957 | * | 6/1999 |
| JP | 2000-075498 A | | 3/2000 |
| JP | 2001-033617 A | | 2/2001 |

OTHER PUBLICATIONS

Official communication issued in the counterpart Japanese Application No. 2001-340145, mailed on Jul. 3, 2007.

* cited by examiner

*Primary Examiner*—Mark F. Huff
*Assistant Examiner*—Daborah Chacko-Davis
(74) *Attorney, Agent, or Firm*—Keating & Bennett, LLP

(57) ABSTRACT

A method for producing an alignment mark is performed such that the alignment mark can be removed from the surface of a substrate without leaving any trace thereof after the alignment mark has been used for alignment. After a first photoresist layer has been formed on a substrate, the first photoresist layer is subjected to patterning, and the alignment mark is thereby formed from the first photoresist layer. In the next step, after a second photoresist layer has been formed so as to cover the alignment mark, the second photoresist layer is subjected to patterning on the basis of the alignment mark. After the surface of the substrate has been subjected to etching by use of a resist mask thus formed, the resist mask and the alignment mark are removed, and the region where the alignment mark has been located is made flat.

12 Claims, 6 Drawing Sheets

METHOD FOR PRODUCING ALIGNMENT MARK

BACKGROUND OF THE INVENTION

1. Field of the Invention

The present invention relates to a method for producing an alignment mark, a method for producing a resist mask, a method for transferring a pattern, a method for producing a substrate provided with identification marks, and a method for manufacturing a ceramic substrate for use in a magnetic head.

2. Description of the Related Art

A ceramic substrate for use in a magnetic head is laminated with a magnetic thin layer and the like, and is eventually divided into a plurality of chips. Each of the chips is incorporated into a magnetic head. For the purpose of identifying what substrates the individual chips originate from, it is convenient to record identification information in a prescribed portion on a substrate. For the purpose of identifying what portion of a substrate a chip originates from, it is convenient to allocate unique information to the individual portions (corresponding to the individual chips) of a substrate.

Conventionally, as for the methods for recording the above-described sets of identification information, a method has been widely used in which the sets of identification information are engraved on the surface of a substrate by using a laser marker. According to this method, however, a portion of the substrate surface is melted and scattered by the laser irradiation. As a result, there is a problem in that the engraved portion becomes a source of dust. In the case of a substrate which absolutely must be clean, as in the case of a substrate for use in a magnetic head, dust generation has to be avoided.

Accordingly, a method has been investigated in which identification information is recorded by etching the substrate surface by use of a photoresist mask which has been subjected to patterning. In order to make a large number of chips from a substrate, it is required that identification information should be recorded in the locations respectively corresponding to the individual chips on the substrate with a high degree of accuracy. In order to achieve such accuracy, it is necessary that the alignment of the patterns defining identification information in relation to the substrate is performed with a high degree of accuracy, and accordingly the formation of the alignment marks for alignment on the substrate is required.

In the manufacturing processes of a semiconductor integrated circuit, a variety of thin films are deposited and subjected to etching by the photolithography technique for microfabrication.

Now, a case is considered in which alignment of the interconnection pattern of an upper level performed in relation to the interconnection pattern of an underlying level. In such a case, after the metal film for the upper level interconnections is deposited, a photoresist layer is formed over the metal film. Then, in order to impart a predetermined interconnection pattern to the photoresist layer, the position of a photomask is adjusted in a light exposing apparatus. This position adjustment is performed on the basis of the alignment marks formed on the substrate.

The alignment marks are constituted by the concave portions and convex portions formed on the underlying layers including the substrate surface and the other layers. The alignment marks are formed, for example, from a metal film during the step of patterning the metal film into the lower level interconnections. Such alignment marks need not be finally removed, and usually, often are allowed to remain on the substrate.

In the case where an alignment mark is formed directly on the substrate surface, it is possible that the substrate surface is subjected to etching to form a concave alignment mark on the substrate surface. In the case where identification information is recorded on the substrate surface, however, it is not preferable that there are unnecessary concavities and convexities other than identification information. Accordingly, it is desirable that the alignment mark is neatly removed from the substrate after the alignment process has been completed.

On the basis of the above descriptions, conventional methods for producing an alignment mark are described below. Description will now be made of a conventional method for producing an alignment mark with reference to the drawings.

In the first step, as FIG. 1A shows, a metal film 12 is deposited on the substrate 10, and then a photoresist layer 14 is formed over the metal film 12. In the next step, the pattern defining an alignment mark is transferred on the photoresist layer by patterning the photoresist layer using the photolithography technique. Specifically, the metal film 12 is coated with the positive photoresist layer 14 (the thickness is, for example, 1 μm) by the spin coat method, and then the prescribed region on the photoresist layer is exposed to radiation through a photomask which defines the pattern for the alignment mark. The irradiated portion (the exposed portion) on the photoresist layer 14 is made photolytically to be soluble in a developer. Then, as shown in FIG. 1B, the exposed portion is dissolved in the developer in the developing process, so that a resist mask 15 is formed that is constituted from the nonexposed portion of the photoresist layer.

In the next place, as FIG. 1C shows, an alignment mark 13 is formed from the metal film 12 by etching the portion of the metal film 12 which is not covered with the resist mask 15. The shape and location of the alignment mark 13 are specified by the resist mask 15.

In the next step, the resist mask 15 is removed, as FIG. 1D shows, and then a second photoresist layer (the thickness is, for example, 1 μm) 16 is formed so as to cover the alignment mark 13, as FIG. 1E shows.

As FIG. 1F shows, a prescribed portion of the second photoresist layer 16 is exposed and developed by the photolithography technique, and thus the patterning of the second photoresist layer 16 is performed. In this way, a resist mask 17 is formed which has an opening portion 18 defining identification information.

As FIG. 1G shows, by etching the region on the substrate surface which is not covered with the above described resist mask 17, a concave portion 20 is formed which displays identification information on the surface of the substrate 10. After this process, the resist mask 17 is removed, as FIG. 1H shows.

In the case where identification information is recorded on the surface of the substrate 10 according to the above described methods, the alignment mark 13 still remains in the region on the substrate surface where no identification information is recorded.

If there is an unnecessary convex portion such as the alignment mark 13 in a substrate provided with identification information as described above, many problems occur including the flatness of the multi-layer structure to be formed on the substrate 10 being degraded. In the case where identification information is engraved on the back side of the substrate 10, if the above described alignment mark 13 remains on the back side of the substrate 10, there is also a concern that some problems will occur when the substrate is transported, and the substrate is fixed to the holders (the members for holding a substrate) in a variety of instruments.

For the purpose of overcoming such problems, it is preferable that the alignment mark 13 is removed from the substrate 10 at the time that the alignment process ends and the alignment mark 13 becomes unnecessary. However, in order to remove the alignment mark 13 formed from the metal film 12 from the substrate 10, a process is necessary in which the alignment mark 13 is completely etched away by use of an appropriate etchant.

Etching of metal is also conducted when the alignment mark 13 is formed from the metal film 12. In this case, if the patterning of the metal film 12 is needed to be performed with a high accuracy, it is necessary that the etching is conducted by using, for example, a dry etcher. However, it is difficult to carry out the dry etching over a wide surface area of a substrate with a uniform rate, and accordingly, it is necessary to adopt the etching conditions that allow overetching to occur in order to prevent insufficient etching from occurring. In the case where such conditions are adopted, as FIG. 2 shows, steps A are formed in the edge portions of the alignment mark 13 in some cases. Such steps A persist after the removal of the alignment mark 13, and thus possibly cause the degradation of the read accuracy when identification information is optically read.

SUMMARY OF THE INVENTION

In order to overcome the problems described above, preferred embodiments of the present invention provide a method for producing an alignment mark that can be easily removed from the substrate surface without leaving any trace of the alignment mark, after the alignment mark has been used for alignment in the lithography process.

In addition, preferred embodiments of the present invention provide a method for producing a resist mask based on a method for producing an alignment mark according to another preferred embodiment of the present invention described in the preceding paragraph, a method for transferring a pattern, a method for producing a substrate provided with identification information, and a method for manufacturing a ceramic substrate for use in a magnetic head.

According to a first preferred embodiment of the present invention, a method for producing an alignment mark includes forming a photoresist layer and forming the alignment mark from the photoresist layer by patterning the photoresist layer.

This method may also include a step of depositing a barrier film over the alignment mark.

According to another preferred embodiment of the present invention, a method of producing a resist mask includes the steps of forming a first photoresist layer over an object for performing pattern transfer, forming an alignment mark from the first photoresist layer by patterning the first photoresist layer, forming a second photoresist layer so as to cover the alignment mark, and patterning the second photoresist layer on the basis of the alignment mark.

It is preferred that the step of patterning the second photoresist layer includes the steps of exposing a portion of the second photoresist layer after alignment has been performed on the basis of the alignment mark and forming the resist mask by subjecting the second photoresist layer to development.

It is also preferred that first photoresist layer is formed from a material which is not softened by the solvent contained in the second photoresist layer, such as a rubber-based photoresist layer.

This method also preferably may include a step of depositing a barrier film so as to cover the alignment mark after the alignment mark has been formed and before the second photoresist layer is formed.

It is also preferred that the step of depositing the barrier film includes a step of forming an aluminum film by a sputtering method.

According to another preferred embodiment of the present invention, a method for transferring a pattern to an object includes the steps of forming a first photoresist layer over the object, forming an alignment mark from the first photoresist layer by patterning the first photoresist layer, forming a second photoresist layer over the object so as to cover the alignment mark, patterning the second photoresist layer on the basis of the alignment mark, and transferring a pattern of the second photoresist layer into a surface of the object.

It is preferred that the step of transferring the pattern of the second photoresist layer into the object includes a step of etching the region of the surface of the object which is not covered with the second photoresist layer.

Alternatively, it is preferred that the step of transferring the pattern of the second photoresist layer into the object includes a step of forming a convex portion in the region of the surface of the object which is not covered with the second photoresist layer.

Alternatively, it is preferred that the step of transferring the pattern of the second photoresist layer into the object includes a step of conducting a surface modification treatment for the region of the surface of the object which is not covered with the second photoresist layer.

It is also preferred that the second photoresist layer and the alignment mark are removed after the pattern has been transferred to the object.

The object in the above-described method may comprise one layer of thin film, and the thin film is patterned by the step of etching.

According to another preferred embodiment of the present invention, a method for producing a substrate provided with identification marks, includes the step of providing a substrate, forming a first photoresist layer over the substrate, forming an alignment mark from the first photoresist layer by patterning the first photoresist layer, forming a second photoresist layer over the substrate so as to cover the alignment mark, patterning the second photoresist layer on the basis of the alignment mark, and transferring a pattern of the second photoresist layer into a surface of the substrate. The substrate is preferably formed of a ceramic material.

According to yet another preferred embodiment of the present invention, a method for manufacturing a ceramic substrate provided with identification marks for use in a magnetic head, includes the steps of providing a ceramic substrate, forming a first photoresist layer on the ceramic substrate, forming an alignment mark from the first photoresist layer by patterning the photoresist layer, covering the alignment mark with a second photoresist layer, exposing a region of the second photoresist layer after alignment has been performed on the basis of the alignment mark, forming a resist mask by subjecting the second photoresist layer to development, recording identification information on the ceramic substrate by use of the resist mask, and removing the second photoresist layer and alignment mark.

Other features, elements, characteristics and advantages of the present invention will become more apparent from the following detailed description of preferred embodiments thereof with reference to the attached drawings.

DETAILED DESCRIPTION OF PREFERRED EMBODIMENTS

In preferred embodiments of the present invention, an alignment mark is formed from a photoresist. A photoresist can be more easily removed than a metal film, and does not leave concavities and convexities (traces) such as unnecessary steps on the substrate after the removal. Thus, according to preferred embodiments of the present invention, after a necessary step of transferring a pattern has been completed, the alignment mark used for alignment is removed, and the region other than the region where the transferred pattern has been formed can be made flat.

Preferred Embodiment 1

Description is made below of a first preferred embodiment of a method for producing an alignment mark according to the present invention with reference to the drawings. In the present preferred embodiment, identification information is engraved on a $Al_2O_3$—TiC based ceramic wafer preferably including two types of composite materials, namely, $Al_2O_3$ and TiC.

Figure 3A:
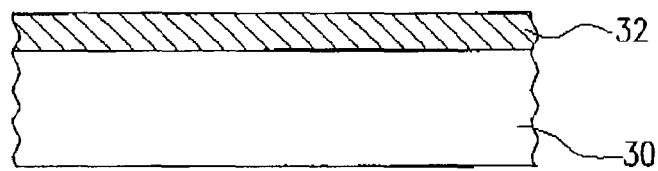
FIGS. 3A to 3F are the sectional views illustrating the processes according to a first preferred embodiment of the method for transferring a pattern according to the present invention.
Figure 3B:
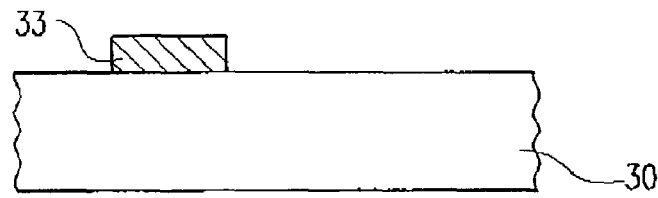

In the first place, as FIG. 3A shows, after a first photoresist layer 32 having a thickness of the order of about 0.1 µtm to about 10 µm has been formed on the ceramic substrate 30, a prebake process is performed for the purpose of evaporating the solvent in the resist material. The temperature and duration of the prebake process are appropriately set according to the type of the photoresist. Then, as FIG. 3B shows, the photoresist layer 32 is exposed and developed, and thus an alignment mark 33 is formed from the first photoresist layer 32.

Figure 5:
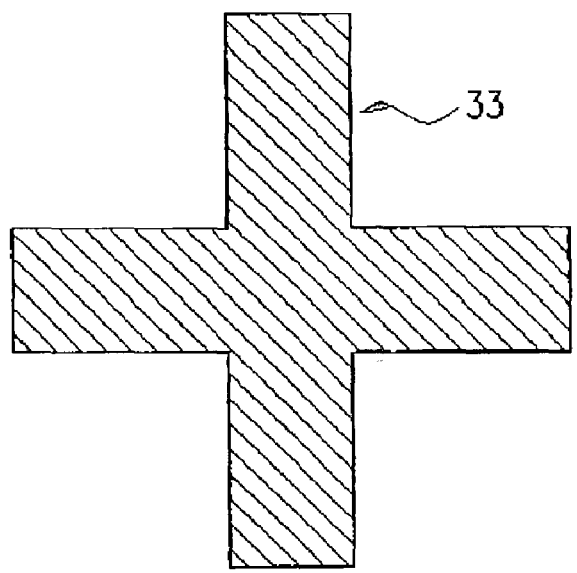
FIG. 5 is a plane view illustrating an example of a plane layout of an alignment mark formed by a method according to a preferred embodiment of the present invention.

In the present preferred embodiment, after the substrate 30 has been coated with a negative rubber-based photoresist layer 32 by the spin coat method or the other suitable method, light is irradiated to the prescribed region on the photoresist layer 32 through a photomask defining the pattern of the alignment mark. Since the photoresist layer 32 used in the present preferred embodiment is of the rubber-based negative type, the light irradiated portion (exposed portion) becomes insoluble in a developer owing to the photo-crosslinking reaction. By dissolving the unexposed portion in the developer in the step of development, the alignment mark 33 can be formed from the exposed portion of the photoresist layer 32. It is preferable to apply a postbake process to the alignment mark 33 thus formed. The temperature and duration of the postbake process are appropriately set according to the type of the photoresist. The alignment mark 33 has, for example, a plane layout (pattern) as shown in FIG. 5, but its shape is optional.

Figure 3C:
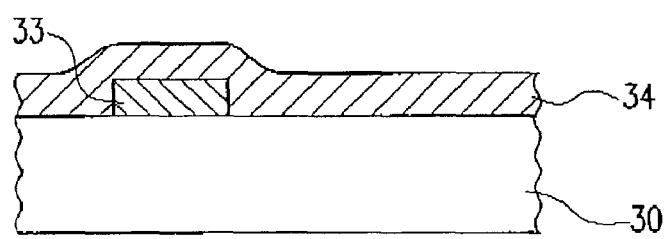

In the next step, as FIG. 3C shows, a second photoresist layer 34 having a thickness of the order of about 5 nm to about 10 µm) is formed so as to cover the alignment mark 33. Specifically, by coating the substrate 30 with a novolak-based or rubber-based photoresist by use of the spin coat method or other suitable method, the second photoresist layer 34 is formed. In the present preferred embodiment, the first photoresist layer 32 is formed with a material which is not softened by the solvent contained in the second photoresist layer 34. In the case where the second photoresist layer 34 is formed with a positive photoresist material suitable for microfabrication, an alignment mark that has excellent stability can be obtained, when the first photoresist layer 32 is formed with a rubber-based photoresist material.

According to preferred embodiments of the present embodiment, the alignment mark 33 formed from the first photoresist layer 32 is directly in contact with the second photoresist layer 34. However, the material of the alignment mark 33 is not affected adversely by the solvent contained in the second photoresist layer 34, so that the shape of the alignment mark 33 can be maintained properly, and the alignment mark 33 functions stably and reliably.

Figure 6A:
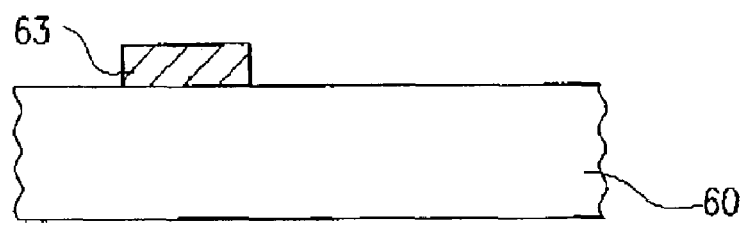
FIG. 6A is a sectional view illustrating an alignment mark formed from a positive photoresist layer.
Figure 6B:
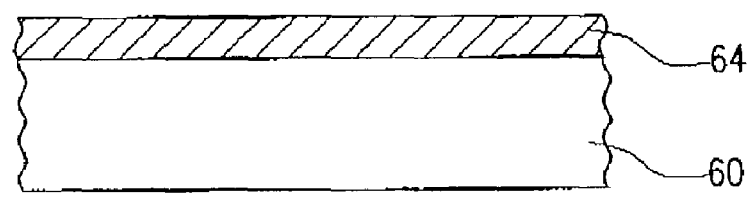
FIG. 6B is a sectional view illustrating the condition where a positive photoresist layer is applied over an alignment mark.

On the contrary, in the case where the first photoresist layer is formed with a material which is dissolved in contact with the second photoresist layer, an alignment mark 63 shown in FIG. 6A is dissolved and is made to disappear by coating the second photoresist layer 64, as FIG. 6B shows, so that alignment cannot be performed. In the case where a rubber-based photoresist is used as the material of the first photoresist layer, even when the second photoresist layer is formed with a rubber-based resist or a novolak-based resist, the alignment mark is not dissolved and is not made to disappear, and thus, a stable alignment mark can be obtained. This effect does not depend on whether the photoresist of each layer is of the positive type or of the negative type.

Figure 3D:
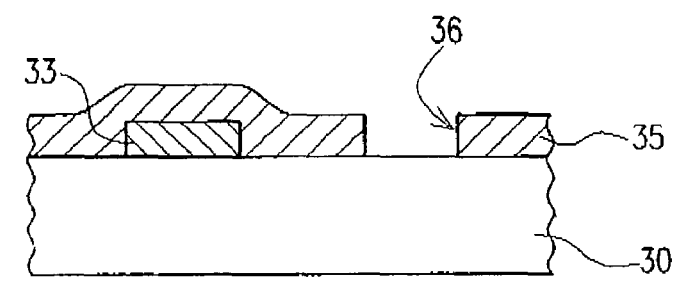

In the next step, as FIG. 3D shows, by using the photolithography technique a prescribed portion on the second photoresist layer 34 is exposed and developed, and thus, the patterning of the second photoresist layer 34 is performed. In this way, a resist mask 35 is formed which has a plurality of opening portions 36 defining identification information. The plane shape of each of the opening portions 36 has, for example, the shape of a digit or an alphabet letter. Incidentally, it is preferable that a prebake process is performed before the exposing process, and a postbake process is performed after the developing process.

Figure 3E:
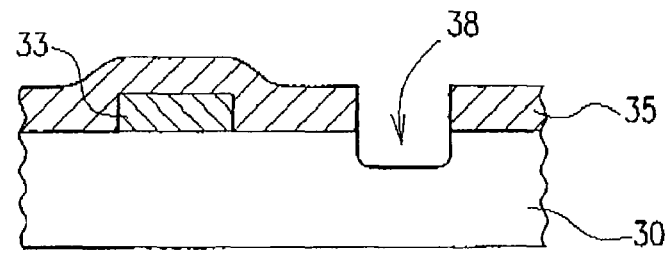

After the resist mask 35 has been formed by the patterning of the second photoresist layer 34, as FIG. 3E shows, the region on the substrate surface which is not covered with the resist mask 35 is subjected to etching to form a concave portion 38 on the surface of the substrate 30. As for the etching process, an appropriate method can be adopted according to the material for the particular substrate used. In the present preferred embodiment, a composite ceramic substrate is preferably used, and accordingly, it is preferable that the substrate is subjected to selective etching according to a method is described in detail in U.S. Pat. No. 6,449,123, entitled "Method For Marking A Sintered Product And For Fabricating Magnetic Head Substrate" by inventors Shimizu Tsujimoto and Takayuki Morikawa, filed Jul. 21, 2000 and issued on Sep. 10, 2002, which is hereby incorporated by reference. According to the selective etching, even if a concave portion 38 is made to be shallow, a minute concavity or convexity can be formed on the surface to be subjected to etching so that a light reflectance contrast sufficient for recognition of a set of identification information can be obtained.

Following the above described etching process, the resist mask 35 and the alignment mark 33 are removed with a resist exfoliation liquid. Thus, as FIG. 3F shows, the substrate 30 can be obtained which has the concave portion 38 on the surface thereof displaying identification information.

As for the above described etching process, in the case where a plasma etching high in anisotropy such as the reactive ion etching (RIE) or other suitable process is performed, the uncovered surface portion of the substrate 30 and the uncovered surface of the resist mask 35 are exposed to the plasma. When the surface of the resist mask 35 is exposed to the plasma, the ions present in the plasma irradiate the resist mask 35 with high energies so that sometimes the resist mask 35 is modified in such a way that it becomes difficult to exfoliate the resist mask 35 from the substrate 30. In such a case, it is preferable that after the resist mask 35 has been incinerated using a resist asher such as an oxygen plasma system, the resist residual is removed using a washing liquid. Incidentally, even in the case where the resist mask 35 is hardened by the ions present in the etching plasma, the alignment mark 33 is covered with the resist mask 35 so that the alignment mark 33 is kept from the ion bombardment and accordingly, it does not become difficult to exfoliate the alignment mark 33 from the substrate 30. Accordingly, if a resist exfoliation method well known in the art that can remove the resist mask 35 is used, it is easy to remove the alignment mark 33 together with the resist mask 35.

Figure 3F:
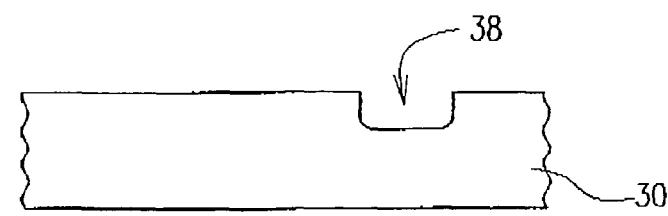

According to the present preferred embodiment, after the pattern of the resist mask 35 has been transferred to the substrate 30, the alignment mark 33 can be removed without leaving any trace thereof on the substrate 30 (FIG. 3F). Additionally, the alignment mark 33 can be removed together with the resist mask 35 in the step of removing the resist mask 35, so that the removing process is simplified as compared to the case where an alignment mark formed from a metallic material is removed.

Preferred Embodiment 2

Description is made below of a second preferred embodiment of a method for producing an alignment mark according to the present invention with reference to FIG. 4.

Figure 4A:
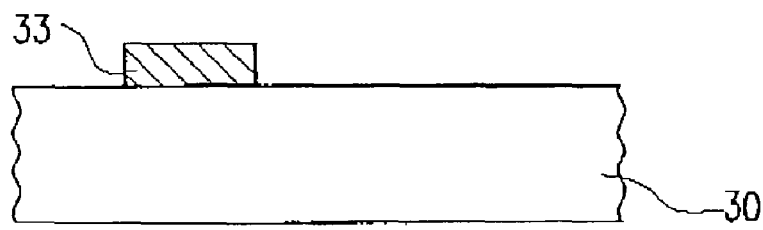
FIGS. 4A to 4D are the sectional views illustrating the processes according to a second preferred embodiment of the method for transferring a pattern according to the present invention.

In the first place, according to the method similar to that used in the first preferred embodiment, an alignment mark 33 having a thickness of about 0.1 µm to about 10 µm is formed on a substrate 30 (FIG. 4A). Specifically, after the substrate has been coated with a negative photoresist by a spin coat method or other suitable process, light is irradiated to the prescribed portion on the negative photoresist layer through a photomask defining the pattern for the alignment mark. The light irradiated portion (exposed portion) on the photoresist layer becomes insoluble in a developer owing to the photo-crosslinking reaction. By dissolving the unexposed portion in the developer in the development process, the alignment mark 33 can be formed which is made from the exposed portion of the photoresist layer. It is preferable to apply a postbake process to the alignment mark 33 thus formed at the temperature and with the duration appropriately set according to the type of the photoresist.

Figure 4B:
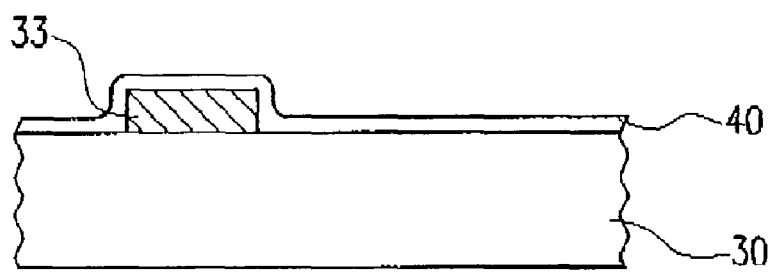

In the next place, as FIG. 4B shows, a barrier film 40 having a thickness of about 5 nm to about 10 µm is formed so as to cover the alignment mark 33. Specifically, it is preferable to deposit a metal film (at least in one layer) such as an aluminum film or other suitable film by means of the thin film deposition technique such as the sputtering method or other suitable process. The barrier film 40 functions to keep the photoresist layer to be formed thereon from contact with the alignment mark 33 on the underlying layer. It is preferable to set the thickness of the barrier film 40 to be, for example, about 20 nm or more and about 100 nm or less, from the viewpoint that the recognition rate of the alignment mark is increased and the time required for removing the alignment mark is reduced. The barrier film 40 can function satisfactorily even with a small thickness, and accordingly, it is preferable that the barrier film 40 is formed to be thinner than the alignment mark 33 (the first photoresist layer).

Figure 4C:
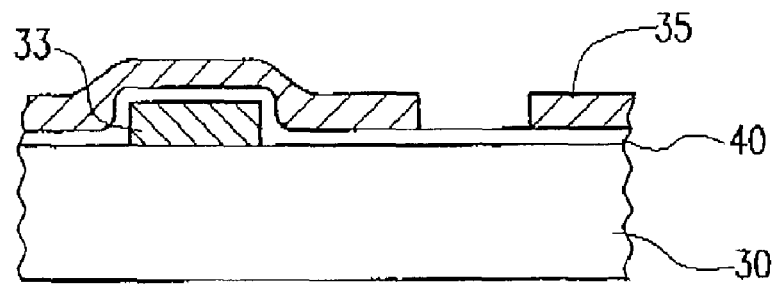

In the next step, as FIG. 4C shows, after a second photoresist layer having a thickness of the order of about 5 nm to about 10 µm has been formed over the barrier film 40, the exposing and developing processes are performed to form a resist mask 35. Specifically, the substrate 30 is coated with a novolak-based photoresist by means of the spin coat method or other suitable process. In the present preferred embodiment, the interposition of the carrier film 40 does not allow the direct contact between the second photoresist layer and the alignment mark 33, and accordingly it is not necessary to form the first photoresist layer with a material which is not softened by the solvent contained in the second photoresist layer. In other words, the first photoresist layer and the second photoresist layer may be formed with the same positive photoresist material.

Figure 1A:
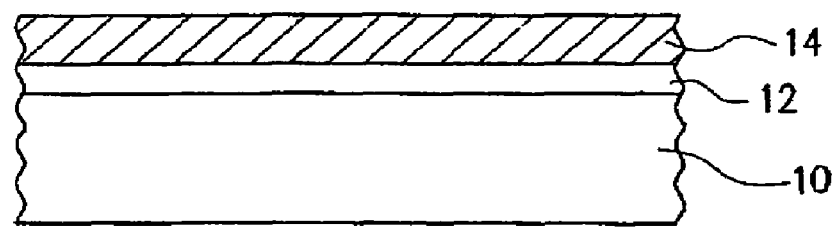
FIGS. 1A to 1D are sectional views illustrating the processes in a conventional method for producing an alignment mark.
Figure 1B:
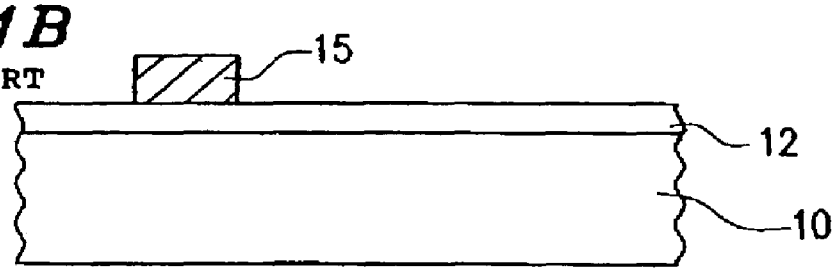
Figure 1C:
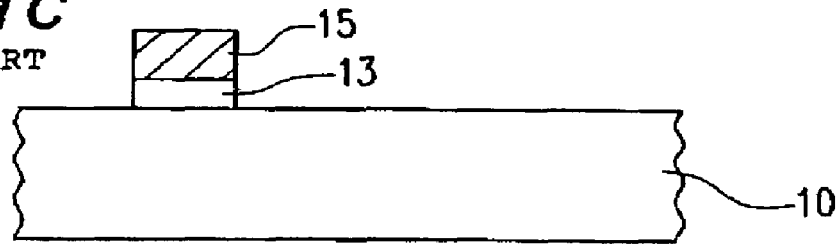
Figure 1D:
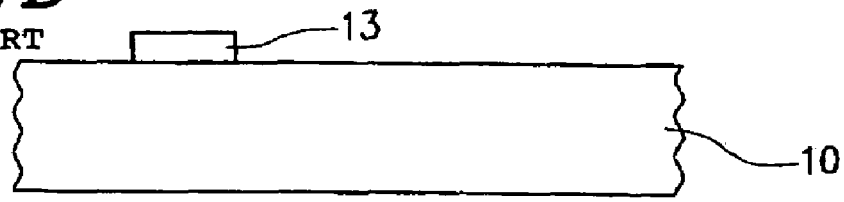
Figure 1E:
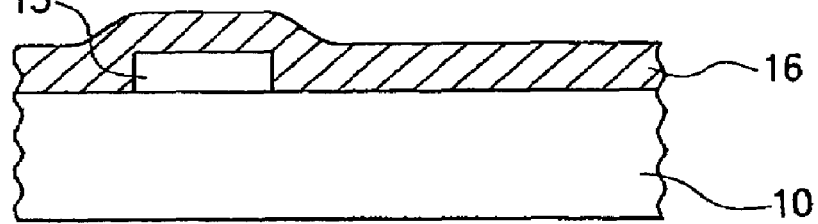
FIGS. 1E to 1H are sectional views illustrating the processes in a method for etching a selected region on a substrate by fabricating a resist mask by use of an alignment mark formed on the basis of the conventional method.
Figure 1F:
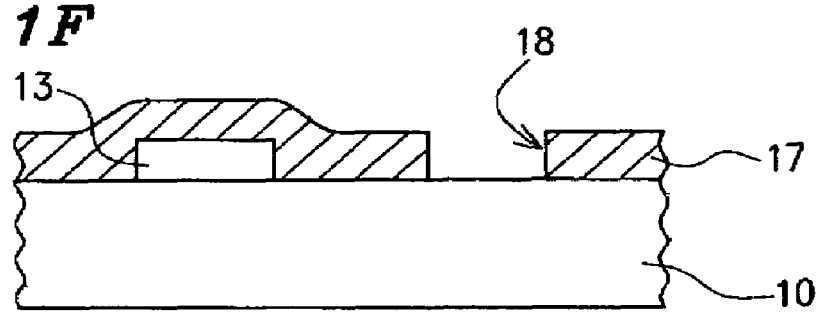
Figure 1G:
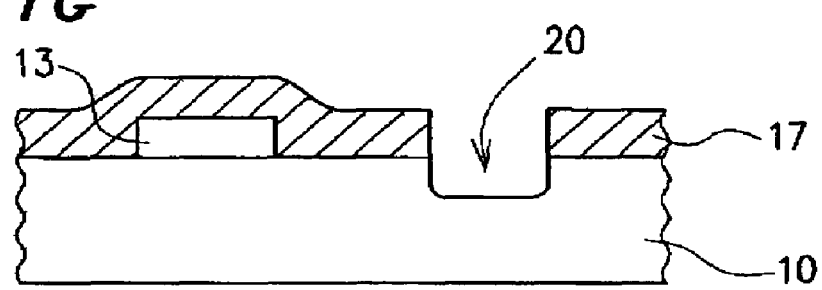
Figure 1H:
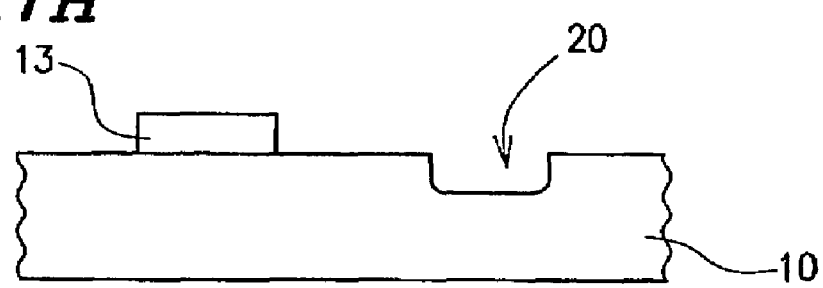
Figure 2A:
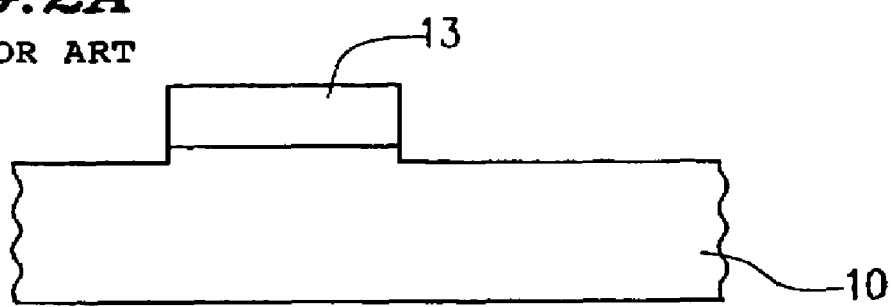
FIG. 2A is a sectional view illustrating the surface region of a substrate where a conventional alignment mark is formed.
Figure 2B:
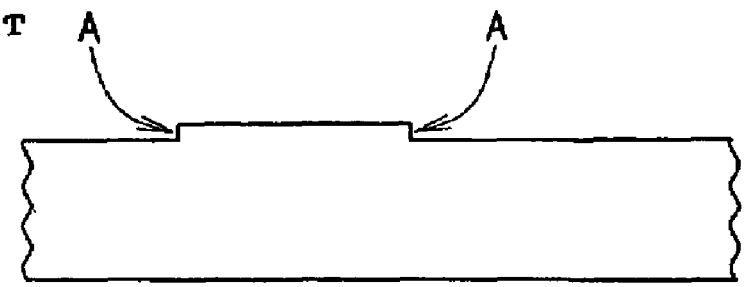
FIG. 2B is a sectional view illustrating the steps of processing the substrate surface after the alignment mark has been removed.
Figure 4D:
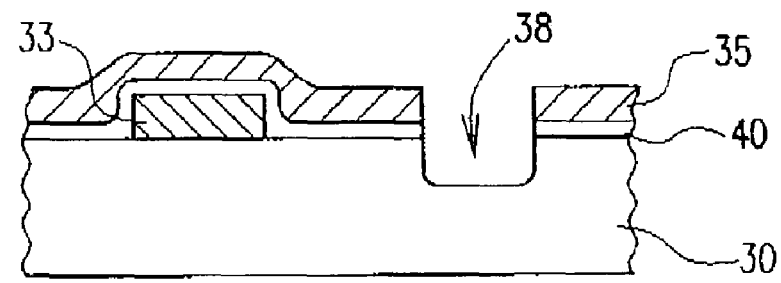

In the next step, as FIG. 4D shows, the surface regions of the barrier film and substrate 30 which are not covered with the resist mask 35 are subjected to etching to form a concave portion 38 on the substrate 30. Following the above described etching process, the resist mask 35 is removed with a resist exfoliation liquid. Subsequently, the barrier film 40 and the alignment mark 33 are successively removed from the substrate 30. In the case where an aluminum film is used as the barrier film 40, the removal of the barrier film 40 can be performed by use of, for example, chemical etching. In the present preferred embodiment, an etching process exhibiting a high anisotropy is not needed for removing the barrier film 40, so that it is possible to remove the barrier film 40 without forming such steps on the substrate surface as shown in FIG. 2B even in the case where the barrier film 40 is formed with a metal film. Similarly to the first preferred embodiment, the alignment mark 33 can be removed using, for example, a resist exfoliation liquid.

Also according to the present preferred embodiment, it is possible to remove the alignment mark 33 without leaving any trace thereof on the substrate 30 in a manner similar to that in the first preferred embodiment, after the pattern for the resist mask 35 has been transferred to the substrate 30. Additionally, in the present preferred embodiment, the alignment mark 33 formed from the photoresist is covered with the barrier film 40, so that it is possible to form the first photoresist layer and the second photoresist layer with the same material.

As the material for the barrier film, there can be used metal films or alloy films of the metals other than aluminum such as Ni, Fe, Cu and others, insulating film materials such as $SiO_2$, or laminate films made of these films.

In each of the above described preferred embodiments, the etching method is used as the method for transferring the pattern for the resist mask 35 to the substrate 30. However, the pattern transfer in the present invention is not limited to the etching method, and by using the thin film deposition techniques such as a sputtering method, CVD method, or other suitable process, a convex portion may be formed in the substrate surface region which is not covered with the resist mask 35 (the liftoff method). Additionally, it is possible to write identification information on the substrate even by modifying the uncovered surface region of the substrate 30 on the basis of the irradiation of an energy beam such as an ion beam, instead of forming concavities and convexities on the surface of the substrate 30 by using the etching method, liftoff method, or other suitable process. The modification of the substrate surface varies the physical parameters such as the reflectance property, conductivity, and the like, so that the detection of the variation of any of these parameters makes it possible to recover identification information from the substrate.

The object, to which a variety of patterns including the pattern carrying identification information are transferred, is not limited to a ceramic substrate. Additionally, such an object is not limited to a substrate or wafer, but may be any type of material as long as the object has a surface with two-dimensional spread to which a pattern can be transferred. The surface concerned does not need to be a flat surface, and may be a curved surface. Therefore, it is possible to perform microfabrication of the surface of an optical element such as a lens or the like by use of the method for producing an alignment mark according to preferred embodiments of the present invention. If unnecessary concavities and convexities are formed on the surface of an optical element, the optical characteristics thereof are varied. If the alignment mark formed by preferred embodiments of the present invention is used, after the pattern for a diffraction grating, a microlens array, or the like has been transferred on the optical member, the alignment mark which is no longer necessary can be removed from the surface without leaving any trace thereof.

When the pattern of the resist mask 35 is transferred to a ceramic wafer or a silicon wafer, this pattern transfer process is not limited to the case where the pattern transfer process is conducted before a variety of magnetic thin films are deposited. Identification information can be transferred on a wafer at an optional step such as a midway step in a series of thin film deposition processes and patterning processes, or at a step after the completion of the series of processes. Accordingly, the object (substrate) subjected to the alignment mark formation may be an insulator film, a conductor film, or a magnetic film deposited on a substrate.

Additionally, the pattern to be transferred is optional. In the case where the substrate is a conductor film, if a wiring pattern is transferred from the resist mask to the substrate, namely, the conductor film, a wiring can be formed from the conductor film.

In each of the above described preferred embodiments, after the alignment mark has been formed, the second photoresist layer is preferably formed. However, the present invention is not limited to such a method. On the basis of an alignment mark formed from a photoresist layer, a variety of patterns including identification information may be formed on a substrate while directly scanning the substrate surface with a laser beam.

According to preferred embodiments of the present invention, an alignment mark is formed from a photoresist, after the step of transferring a pattern has been completed which uses the alignment mark for alignment, the alignment mark can be easily removed from the substrate surface without leaving any trace thereof. Consequently, unnecessary steps or concavities and convexities are left on the substrate surface, and hence it is possible that only the desired pattern is transferred to the substrate.

It should be understood that the foregoing description is only illustrative of the present invention. Various alternatives and modifications can be devised by those skilled in the art without departing from the present invention. Accordingly, the present invention is intended to embrace all such alternatives, modifications and variances which fall within the scope of the appended claims.

What is claimed is:

1. A method for transferring a pattern to an object, comprising the steps of:
    forming a first photoresist layer over the object, said first photoresist layer being made of a first material;
    forming an alignment mark from said first photoresist layer by removing a portion other than an alignment mark forming portion of said first photoresist layer, the alignment mark being made of the alignment mark forming portion of the first photoresist layer;
    forming a second photoresist layer over the object so as to cover said alignment mark, said second photoresist layer being made of a second material that is different from the first material;
    patterning said second photoresist layer on the basis of said alignment mark;
    transferring a pattern of the second photoresist layer into a surface of the object; and
    removing said second photoresist layer and said alignment mark; wherein
    a pattern of the alignment mark is not transferred into the surface of the object.

2. The method of claim 1, wherein the step of transferring the pattern of the second photoresist layer into the object comprises a step of etching a region of the surface of said object which is not covered with said second photoresist layer.

3. The method of claim 2, wherein said second photoresist layer and said alignment mark are removed after said pattern has been transferred to said object.

4. The method of claim 2, wherein said object comprises at least one layer of thin film, and said thin film is patterned by said step of etching.

5. The method of claim 1, wherein the step of transferring the pattern of the second photoresist layer into the object comprises a step of forming a convex portion in a region of the surface of said object which is not covered with said second photoresist layer.

6. The method of claim 5, wherein said second photoresist layer and said alignment mark are removed after said pattern has been transferred to said object.

7. The method of claim 1, wherein the step of transferring the pattern of the second photoresist layer into the object comprises a step of conducting a surface modification treatment for a region of the surface of said object which is not covered with said second photoresist layer.

8. The method of claim 7, wherein said second photoresist layer and said alignment mark are removed after said pattern has been transferred to said object.

9. The method of claim 1, wherein said second photoresist layer and said alignment mark are removed after said pattern has been transferred to said object.

10. A method for producing a substrate provided with identification marks, comprising the steps of:
providing a substrate; and
forming a first photoresist layer over the substrate, said first photoresist layer being made of a first material;
forming an alignment mark from said first photoresist layer by removing a portion other than an alignment mark forming portion of said first photoresist layer, the alignment mark being made of the alignment mark forming portion of the first photoresist layer;
forming a second photoresist layer over the substrate so as to cover said alignment mark, said second photoresist layer being made of a second material that is different from the first material;
patterning said second photoresist layer on the basis of said alignment mark;
transferring a pattern of the second photoresist layer into a surface of the substrate; and
removing said second photoresist layer and said alignment mark; wherein
a pattern of the alignment mark is not transferred into the surface of the substrate.

11. The method of claim 10, wherein said substrate is formed of a ceramic material.

12. A method for manufacturing a ceramic substrate provided with identification marks for use in a magnetic head, comprising the steps of:
providing a ceramic substrate;
forming a first photoresist layer on said ceramic substrate, said first photoresist layer being made of a first material;
forming an alignment mark from said first photoresist layer by removing a portion other than an alignment mark forming portion of said first photoresist layer, the alignment mark being made of the alignment mark forming portion of the first photoresist layer;
covering said alignment mark with a second photoresist layer, said second photoresist layer being made of a second material that is different from the first material;
exposing a region of said second photoresist layer after alignment has been performed on the basis of said alignment mark;
forming a resist mask by subjecting said second photoresist layer to development;
recording identification information on said ceramic substrate by use of said resist mask; and
removing said second photoresist layer and alignment mark; wherein
a pattern of the alignment mark is not transferred into a surface of the ceramic substrate.

* * * * *